(12) United States Patent
Azuma

(10) Patent No.: US 6,826,087 B2
(45) Date of Patent: Nov. 30, 2004

(54) SEMICONDUCTOR MEMORY STORAGE

(75) Inventor: Ryotaro Azuma, Kyoto (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 0 days.

(21) Appl. No.: 10/353,335

(22) Filed: Jan. 29, 2003

(65) Prior Publication Data
US 2004/0001379 A1 Jan. 1, 2004

(30) Foreign Application Priority Data

Feb. 1, 2002 (JP) ........................................ 2002-025146

(51) Int. Cl.[7] .............................................. G11C 7/00
(52) U.S. Cl. ............................ 365/189.01; 365/189.07; 365/189.09
(58) Field of Search ....................... 365/189.07, 189.09, 365/189.01

(56) References Cited

U.S. PATENT DOCUMENTS 5,459,689 A  10/1995 Hikichi
6,075,718 A  * 6/2000 Fontana et al. ................ 365/94
6,278,638 B1 * 8/2001 Tomita et al. ......... 365/189.07

* cited by examiner

Primary Examiner—Vu A. Le

(57) ABSTRACT

A semiconductor memory device having a memory array is provided. A read unit reads information stored in a memory cell. A step-up unit steps up an externally supplied voltage, and supplies the stepped-up voltage to the memory cell. A start control unit has the step-up unit start the stepping up after a read cycle begins. A detection unit detects that the stepped-up voltage has reached a predetermined level, and has the read unit start the reading upon the detection. A stop control unit has the step-up unit stop the stepping up when a time period required for the reading has elapsed since the detection. With this construction, the time taken for stepping up the voltage supplied to the memory cell is minimized in accordance with the time taken for the reading. Hence the current consumption is reduced when compared with the case where the step-up time is set unnecessarily long.

19 Claims, 8 Drawing Sheets

SEMICONDUCTOR MEMORY STORAGE

This application is based on an application No. 2002-25146 filed in Japan, the contents of which are hereby incorporated by reference.

BACKGROUND OF THE INVENTION

1. Field of the Invention

The present invention relates to a semiconductor memory device, and in particular relates to techniques for reducing the current consumption of a semiconductor memory device that has a read circuit including a step-up power supply.

2. Prior Art

The following method is typically used to read information from a semiconductor memory device equipped in a microcomputer. One of a plurality of memory cells arranged in the form of a matrix is selected by a word line and a bit line, and stored information is sensed by a sense amplifier from a cell current of the selected memory cell. To supply power to the internal circuitry of such a semiconductor memory device, a step-up power supply that steps up an externally-supplied voltage may be equipped in the semiconductor memory device (e.g. Unexamined Japanese Patent Application Publication No. H10-302492).

FIG. 1 shows a construction of a conventional semiconductor memory device that includes a step-up power supply.

In the drawing, a microcomputer 130 is roughly made up of a CPU 121 which controls the overall microcomputer 130, and a semiconductor memory device 120.

The semiconductor memory device 120 includes a step-up power supply 113, a memory array 7, word lines 111, a row decoder 6, bit lines 112, a column decoder 8, a sense amplifier 9, a data latch 110, and a pulse generator 5.

The memory array 7 is made up of a plurality of memory cells which are arranged in the form of a matrix. Each memory cell stores one-bit information.

The word lines 111 are arranged in a Y direction of the memory array 7.

The row decoder 6 selects one of the word lines 111 using voltage Vg supplied from the step-up power supply 113 and address information AddY given from the CPU 121.

The bit lines 112 are arranged in an X direction of the memory array 7.

The column decoder 8 selects one of the bit lines 112 using address information AddX given from the CPU 121.

The sense amplifier 9 reads one-bit information from a memory cell selected by the row decoder 6 and the column decoder 8.

The data latch 110 latches the data read by the sense amplifier 9.

The pulse generator 5 controls the sense amplifier 9 using signals (SLOW and NDS) from the CPU 121.

The step-up power supply 113 includes a reference voltage generator 1, a step-up pump 2, a Vp detector 3, and a differential amplifier 4.

The reference voltage generator 1 generates reference voltage VREF.

The step-up pump 2 generates voltage Vp higher than power supply voltage VDD which is supplied from outside.

The Vp detector 3 controls the step-up pump 2 in accordance with comparison between reference voltage VREF generated by the reference voltage generator 1 and voltage Vp generated by the step-up pump 2.

The differential amplifier 4 generates voltage Vg that is double the level of reference voltage VREF, using voltage Vp.

In such a construction, a read is performed as follows. When address information AddX and AddY are input respectively to the column decoder 8 and the row decoder 6, the row decoder 6 selects one word line 111 according to address information AddY, whereas the column decoder 8 selects one bit line 112 according to address information AddX. The sense amplifier 9 senses the storage contents of a memory cell selected by the word line 111 and the bit line 112, and outputs signal DOUT which is high or low depending on the storage contents. The data latch 110 latches DOUT and outputs the data.

When such a read is performed with a long cycle of several microseconds, usually the sense amplifier 9 is activated only while information is being read from the memory array 7, to reduce current consumption. On the other hand, the step-up power supply 113 constantly generates voltage Vg to guarantee normal read operations.

FIG. 2 shows an operation sequence of the semiconductor memory device 120, when a read is performed with a long cycle.

At time T2, read control signal NDS output from the CPU 121 makes a high to low transition. This causes output SAAV of the pulse generator 5 to transition from low to high. As a result, the sense amplifier 9 which receives SAAV is activated The sense amplifier 9 reads information stored in a selected memory cell, and outputs it as DOUT. At time T3, the pulse generator 5 changes SAAV from high to low. At this point, the data latch 110 latches DOUT, and keeps outputting the data until latching in the next cycle. The sense amplifier 9 is deactivated when SAAV becomes low at time T3.

In the meantime, voltage Vg is steadily generated by the reference voltage generator land the differential amplifier 4. On the other hand, voltage Vp generated by the step-up pump 2 has a waveform with some width, since the step-up pump 2 is activated/deactivated by the Vp detector 3 depending on detection of voltage Vp.

When a read is performed with a long cycle, the sense amplifier 9 is activated only while information is actually being read from the memory array 7, and deactivated once the information has been read and latched. This contributes to a lower current consumption, when compared with the case where the sense amplifier 9 is active during the whole cycle.

Meanwhile, the step-up power supply 113 is active and generates voltage Vg during the whole cycle, as explained earlier. This causes unnecessary current consumption. Given that the step-up power supply 113 consumes a large amount of current, such unnecessary current consumption need be addressed.

SUMMARY OF THE INVENTION

The present invention was conceived in view of the problem described above, and has an object of providing a semiconductor memory device in which the current consumption of a read circuit including a step-up power supply is reduced when compared with conventional semiconductor memory devices.

The stated object can be achieved by a semiconductor memory device having a memory array, including: a read unit operable to read information stored in a memory cell in the memory array; a step-up unit operable to step up a voltage supplied from outside the semiconductor memory device, and supply the stepped-up voltage to the memory cell; a start control unit operable to have the step-up unit start the stepping up after a read cycle begins; a detection unit operable to detect that the stepped-up voltage has reached a predetermined level required for the read unit to read the information from the memory cell, and have the read unit start the reading upon the detection; and a stop control unit operable to have the step-up unit stop the stepping up, when a predetermined time period required for the read unit to complete the reading has elapsed since the detection.

It should be noted here that the step-up unit does not step up the voltage to the predetermined level instantly. Rather, after the start control unit has the step-up unit start the step up, the step-up unit steps up the voltage with time, as a result of which the voltage reaches the predetermined level. The predetermined level here is higher than a power supply voltage supplied from outside, and is a multiple of the reference voltage as one example. The detection by the detection unit is carried out, for example, by comparing a submultiple of the stepped-up voltage (i.e. a voltage obtained by stepping down the stepped-up voltage by means of resistance voltage division) with a constant voltage lower than the power supply voltage.

According to the above construction, the semiconductor memory device starts stepping up the voltage to be supplied to the memory cell, after the read cycle begins. Once the voltage has reached the predetermined level, the actual read operation is launched. The semiconductor memory device stops stepping up the voltage when the predetermined time period has elapsed since the read operation is launched. The predetermined time period here is a time period necessary for the read unit to perform the actual read operation. Thus, the time during which the voltage to be supplied to the memory cell is stepped up is minimized in association with the time taken for the read operation. This contributes to a lower current consumption, when compared with the case where the time during which the voltage is stepped up is unnecessarily long. Especially if the read cycle is relatively long such as several microseconds or more, the time during which the read operation is not performed is longer than the time during which the read operation is performed, within the read cycle. In such a case, if the step up is constantly performed throughout the read cycle, a current is unnecessarily consumed in a long period during which the read operation is not performed. According to the present invention, however, the step up is started little before the actual read operation is launched, and stopped at the same time as the completion of the read operation. This eliminates unnecessarily current consumption in the time during which the read operation is not performed.

Here, the read unit may include: a sense amplifier operable to amplify a cell current of the memory cell and output the amplified cell current, wherein the step-up unit includes: a reference voltage generator operable to generate a constant reference voltage which is no higher than a power supply voltage supplied from outside the semiconductor memory device; a step-up pump operable to generate a first voltage which is higher than the power supply voltage; a differential amplifier operable to generate a second voltage using the first voltage and supply the second voltage to the memory cell, the second voltage increasing with time to the predetermined level that is a predetermined multiple of the reference voltage and is higher than the power supply voltage; and a first voltage detector operable to have the first voltage stay within a fixed range, by comparing the first voltage with the second voltage and activating/deactivating the step-up pump depending on a result of the comparison, wherein the detection unit includes: a second voltage detector operable to (a) detect that the second voltage has reached the predetermined level, by comparing a comparative voltage obtained by stepping down the second voltage with the reference voltage, and (b) activate the sense amplifier upon the detection, the start control unit activates the differential amplifier and the first voltage detector to have the step-up unit start the stepping up, and further activates the second voltage detector, after the read cycle begins, and the stop control unit deactivates the step-up pump, the differential amplifier, and the first voltage detector to have the step-up unit stop the stepping up, and further deactivates the second voltage detector, when the predetermined time period has elapsed since the activation of the sense amplifier.

This construction corresponds to the semiconductor memory device 200 shown in FIG. 3. In detail, the step-up unit corresponds to the step-up power supply 201, the reference voltage generator corresponds to the reference voltage generator 1, the step-up pump corresponds to the step-up pump 2, the differential amplifier corresponds to the differential amplifier 100, the first voltage detector corresponds to the Vp detector 3, the second voltage detector corresponds to the Vg detector 11, and the start control unit and the stop control unit correspond to the control circuit 105.

Here, the semiconductor memory device may further include: a sense amplifier deactivator operable to deactivate the sense amplifier, when the predetermined time period has elapsed since the activation of the sense amplifier; and a sense amplifier output latch operable to hold the output of the sense amplifier for a fixed time period after the deactivation of the sense amplifier.

In a semiconductor memory device, a step-up pump has the largest power consumption, and a sense amplifier has the second largest power consumption. Accordingly, by deactivating the sense amplifier along with the step-up unit including the step-up pump when the read operation ends, power consumption is further reduced. In this case, to obtain the output of the sense amplifier even after the sense amplifier is deactivated, the sense amplifier output latch is equipped in the semiconductor memory device.

Here, the second voltage detector may output a predetermined signal to activate the sense amplifier, wherein the semiconductor memory device further include: a sense amplifier activation signal latch operable to hold the predetermined signal output from the second voltage detector for a set time period, and output the held signal to the sense amplifier.

The second voltage detector outputs the predetermined signal upon detecting that the second voltage generated by the differential amplifier has reached the targeted level. Upon receiving this signal, the sense amplifier is activated. Here, the sense amplifier activation signal latch for latching the signal output from the second voltage detector is equipped in the semiconductor memory device. By activating the sense amplifier according to the output of this latch, even if noise acts upon the output of the differential amplifier and as a result the output of the second voltage detector oscillates, the sense amplifier can operate stably without being affected by such an oscillation. In this way, a malfunction caused by the occurrence of noise affecting the stepped-up voltage is prevented, with it being possible to realize stable read operations.

Here, the differential amplifier may include: a first n-channel transistor operable to make the comparative voltage which is obtained by dividing the second voltage using a resistance voltage divider, equal to the second voltage upon the deactivation of the differential amplifier; a second n-channel transistor operable to interrupt a flow of current through a differential circuit portion of the differential amplifier, upon the deactivation of the differential amplifier; and a p-channel transistor having a gate connected to a node on which the second voltage is provided, and operable to short-circuit the node and the step-up pump upon the deactivation of the differential amplifier.

This construction corresponds to the stop circuit 300 shown in FIG. 6. In detail, the first n-channel transistor corresponds to the n-channel transistor 25, the second n-channel transistor corresponds to the n-channel transistor 23, and the p-channel transistor corresponds to the p-channel transistor 22.

According to this construction, when the differential amplifier is deactivated, an intermediate node potential is set in anticipation of a change which may occur next time the differential amplifier is activated. This keeps the second voltage generated by the differential amplifier from unwantedly exceeding the targeted level upon the activation of the differential amplifier, with it being possible to ensure the stable operation of the differential amplifier.

Here, the differential amplifier may include: a plurality of charge supply p-channel transistors each operable to supply a charge generated by the step-up pump to the differential amplifier; and a conduction control p-channel transistor connected in series to at least one charge supply p-channel transistor out of the plurality of charge supply p-channel transistors, and operable to bring the charge supply p-channel transistor into or out of conduction depending on a read mode.

This construction corresponds to the switch circuit 301 shown in FIG. 6. In detail, the plurality of charge supply p-channel transistors correspond to the p-channel transistors 16 and 17, and the conduction control p-channel transistor corresponds to the p-channel transistor 24.

According to this construction, when the read mode is a high-speed mode with a read cycle of several tens of nanoseconds, all of the charge supply p-channel transistors are used to enhance the charge supply capability and suppress a voltage drop by a load circuit. When the read mode is a low-speed mode with a read cycle of several tens of microseconds, on the other hand, only part of the charge supply p-channel transistors is used to lower the charge supply capability, thereby preventing an overshoot of unwantedly exceeding the targeted level. In this way, the voltage can be generated stably in both the high-speed mode and the low-speed mode.

Here, the second voltage detector may include: a differential circuit portion including a first p-channel transistor and a second p-channel transistor which are current-mirror connected; a third p-channel transistor connected in parallel with the first p-channel transistor which has a gate and a drain connected, and operable to short-circuit the drain of the first p-channel transistor and an output of the power supply voltage upon the deactivation of the second voltage detector; a first n-channel transistor connected with the second p-channel transistor, and operable to ground a drain of the second p-channel transistor upon the deactivation of the second voltage detector; a second n-channel transistor operable to interrupt a flow of current through the differential circuit portion upon the deactivation of the second voltage detector; a fourth p-channel transistor connected with a node on which the second voltage is provided, and operable to change the comparative voltage which is obtained by dividing the second voltage using a resistance voltage divider, to a ground voltage upon the deactivation of the second voltage detector; a third n-channel transistor and a fifth p-channel transistor connected in series with each other, and operable to convert an output of the differential circuit portion to a logic signal; and a cutoff unit operable to bring the third n-channel transistor out of conduction upon the deactivation of the second voltage detector.

This construction corresponds to the stop circuit 401 shown in FIG. 8. In detail, the first p-channel transistor and the second p-channel transistor correspond to the two p-channel transistors 30, the third p-channel transistor corresponds to the p-channel transistor 37, the first n-channel transistor corresponds to the n-channel transistor 36, the second n-channel transistor corresponds to the n-channel transistor 33, the fourth p-channel transistor corresponds to the p-channel transistor 39, the fifth p-channel transistor corresponds to the p-channel transistor 38, and the third n-channel transistor corresponds to the n-channel transistor 40.

According to this construction, when the second voltage detector is deactivated, an intermediate node potential is set in anticipation of a change which may occur next time the second voltage detector is activated. This keeps the second voltage detector from wrongly outputting a detection signal upon the activation. Hence the stable operation of the second voltage detector is ensured.

Here, the second voltage detector may include: a first n-channel transistor having a gate which receives the comparative voltage obtained by dividing the second voltage using a resistance voltage divider; a second n-channel transistor having a gate which receives the reference voltage; and a third n-channel transistor connected in parallel with the first n-channel transistor so that a total capability of the first n-channel transistor connected with the third n-channel transistor is greater than a capability of the second n-channel transistor.

According to this construction, even when the second voltage generated by the differential amplifier is stabilized at a level slightly lower than the targeted level, the second voltage detector is kept from a malfunction of not outputting a detection signal permanently. Hence the normal operation of the second voltage detector is ensured.

Here, the semiconductor memory device may further include: a transistor diode-connected with a node on which the first voltage is provided, and operable to supply a charge from an external power supply to the node if the node falls below the power supply voltage after the deactivation of the step-up pump.

According to this construction, the first voltage at the node corresponding to the output of the step-up pump decreases in a high impedance state due to a leakage of current, but does not fall below VDD-Vt. As a result, the step up in the next read cycle can be started not from a ground level but from VDD-Vt, which contributes to a lower current consumption when compared with the case where the step up is started from a ground level.

Here, the semiconductor memory device may further include: a transistor diode-connected with a node on which the second voltage is provided, and operable to supply a charge from an external power supply to the node if the node falls below the power supply voltage after the deactivation of the differential amplifier.

According to this construction, the second voltage at the node corresponding to the output of the differential amplifier decreases in a high impedance state due to a leakage of current, but does not fall below VDD-Vt. As a result, the step up in the next read cycle can be started not from a ground level but from VDD-Vt, which contributes to a lower current consumption when compared with the case where the step up is started from a ground level.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENT

The following is a description of an embodiment of the present invention with reference to drawings.
(Semiconductor Memory Device 200)

Figure 1:
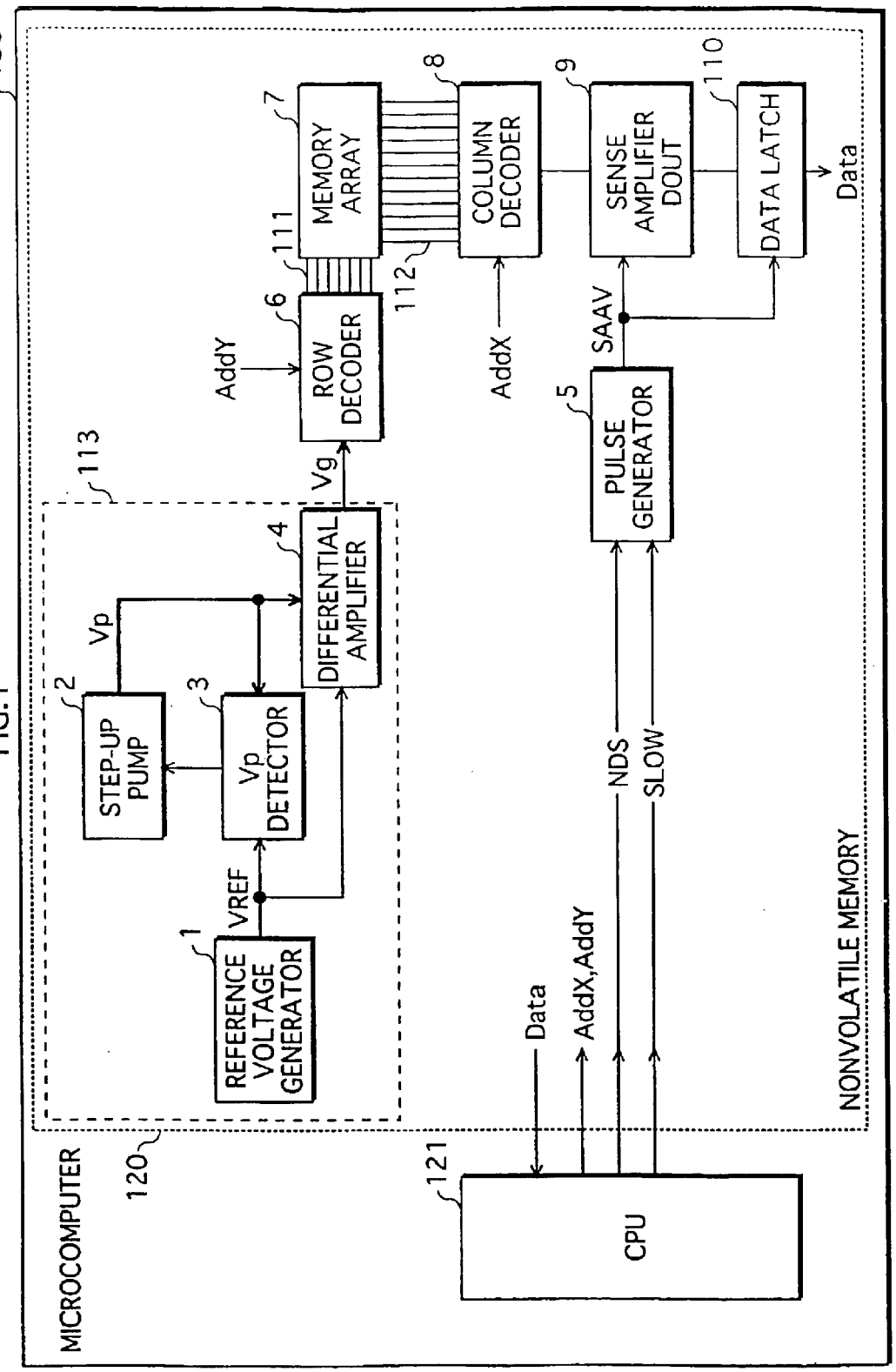
FIG. 1 shows a construction of a conventional semiconductor memory device including a step-up power supply.
Figure 2:
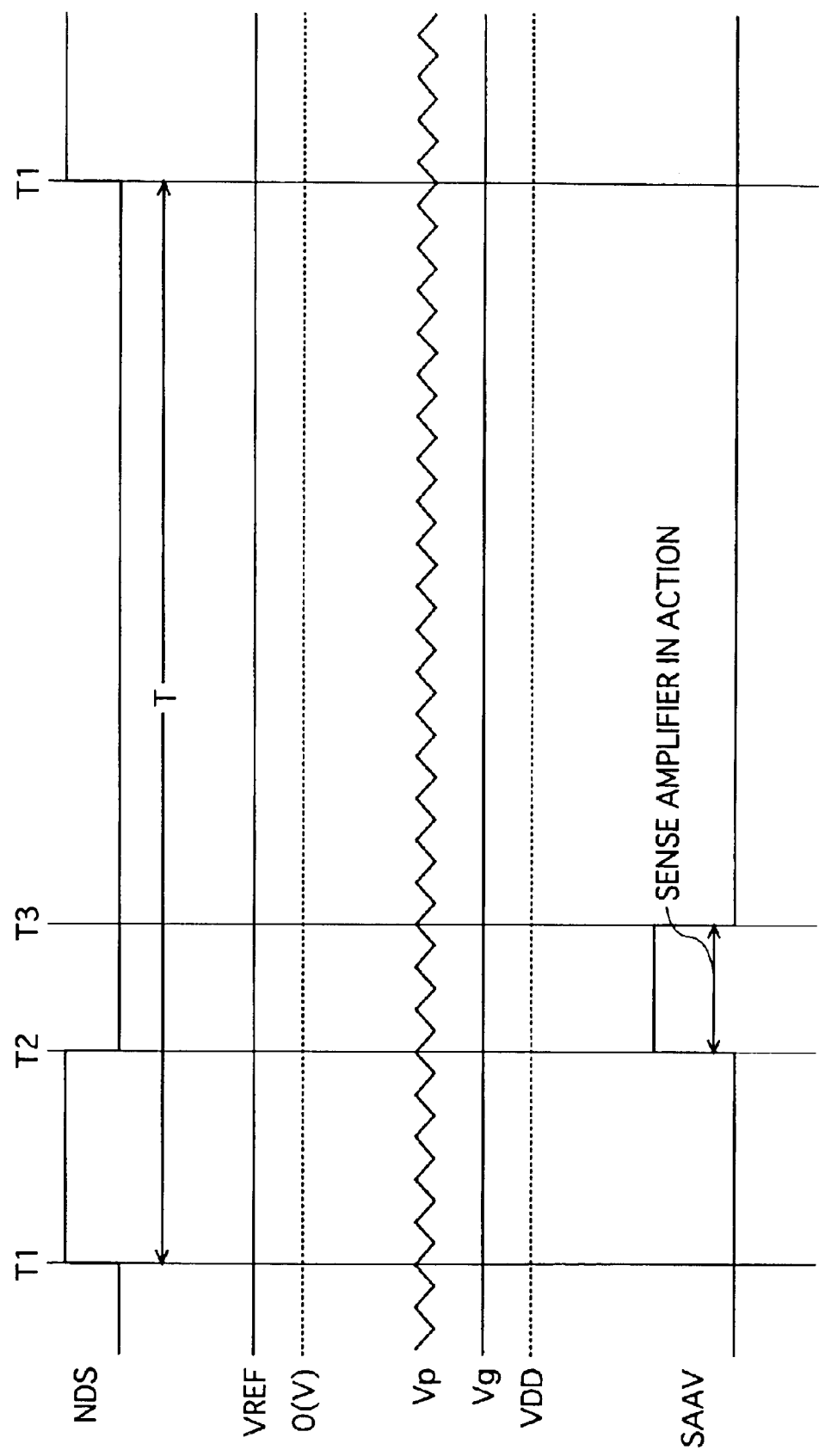
FIG. 2 shows an operation sequence of the semiconductor memory device shown in FIG. 1, when a read is performed with a long cycle.
Figure 3:
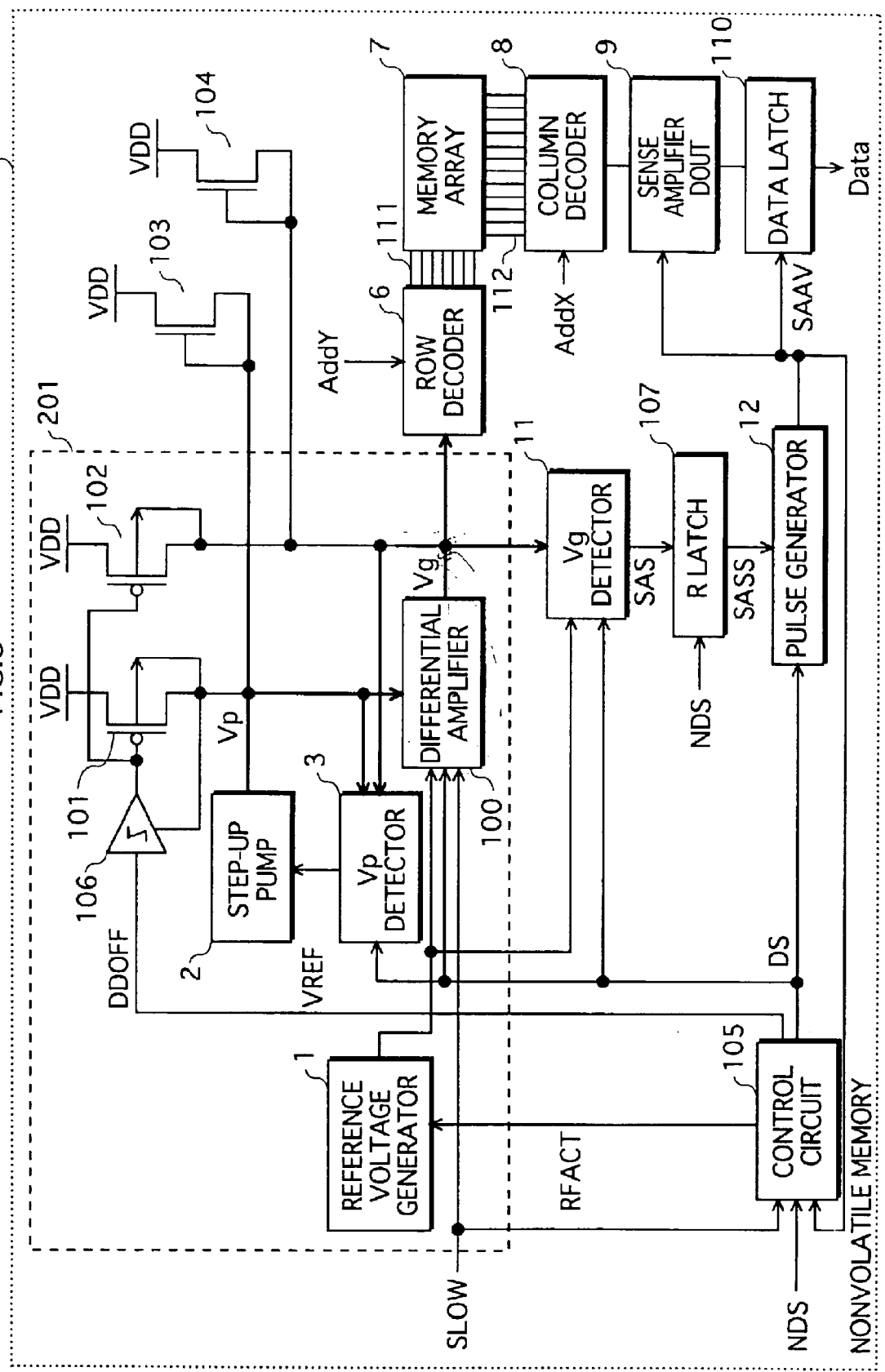
FIG. 3 shows a construction of a semiconductor memory device to which an embodiment of the invention relates.

FIG. 3 shows a construction of a semiconductor memory device to which the embodiment relates. It should be noted that construction elements which are the same as those in the conventional semiconductor memory device 120 shown in FIG. 1 are given the same reference numerals.

In the drawing, a semiconductor memory device 200 includes a step-up power supply 201, the memory array 7, the word lines 111, the row decoder 6, the bit lines 112, the column decoder 8, the sense amplifier 9, the data latch 110, a Vg detector 11, an R latch 107, a pulse generator 12, a control circuit 105, and n-channel transistors 103 and 104.

The memory array 7 is made up of a plurality of memory cells that are arranged in the form of a matrix. Each memory cell stores one-bit information.

The word lines 111 are arranged in the Y direction of the memory array 7.

The row decoder 6 selects one of the word lines 111, using voltage Vg supplied from the step-up power supply 201 and address information AddY given from a CPU.

The bit lines 112 are arranged in the X direction of the memory array 7.

The column decoder 8 selects one of the bit lines 112, using address information AddX given from the CPU.

The sense amplifier 9 reads one-bit information from a memory cell selected by the row decoder 6 and the column decoder 8.

The data latch 110 latches the data read by the sense amplifier 9.

The Vg detector 11 detects that voltage Vg is approximately double the level of reference voltage VREF.

The R latch 107 stores a first leading edge of signal SAS output from the Vg detector 11 after signal NDS becomes low, and outputs signal SASS.

The pulse generator 12 generates signal SAAV for a predetermined time period, upon receiving SASS from the R latch 107 after NDS becomes low.

The control circuit 105 controls the reference voltage generator 1, the Vp detector 3, and a differential amplifier 100 in the step-up power supply 201, the Vg detector 11, and the pulse generator 12.

The step-up power supply 201 includes the reference voltage generator 1, the step-up pump 2, the differential amplifier 100, the Vp detector 3, a level shifter 106, and p-channel transistors 101 and 102.

The reference voltage generator 1 generates reference voltage VREF.

The step-up pump 2 generates voltage Vp.

The differential amplifier 100 generates voltage Vg which is double the level of reference voltage VREF, using voltage Vp generated by the step-up pump 2.

The Vp detector 3 controls the step-up pump 2 based on comparison between voltage Vg and voltage Vp.

The p-channel transistors 101 and 102 supply power supply voltage VDD to the step-up pump 2 and the differential amplifier 100.

Figure 4:
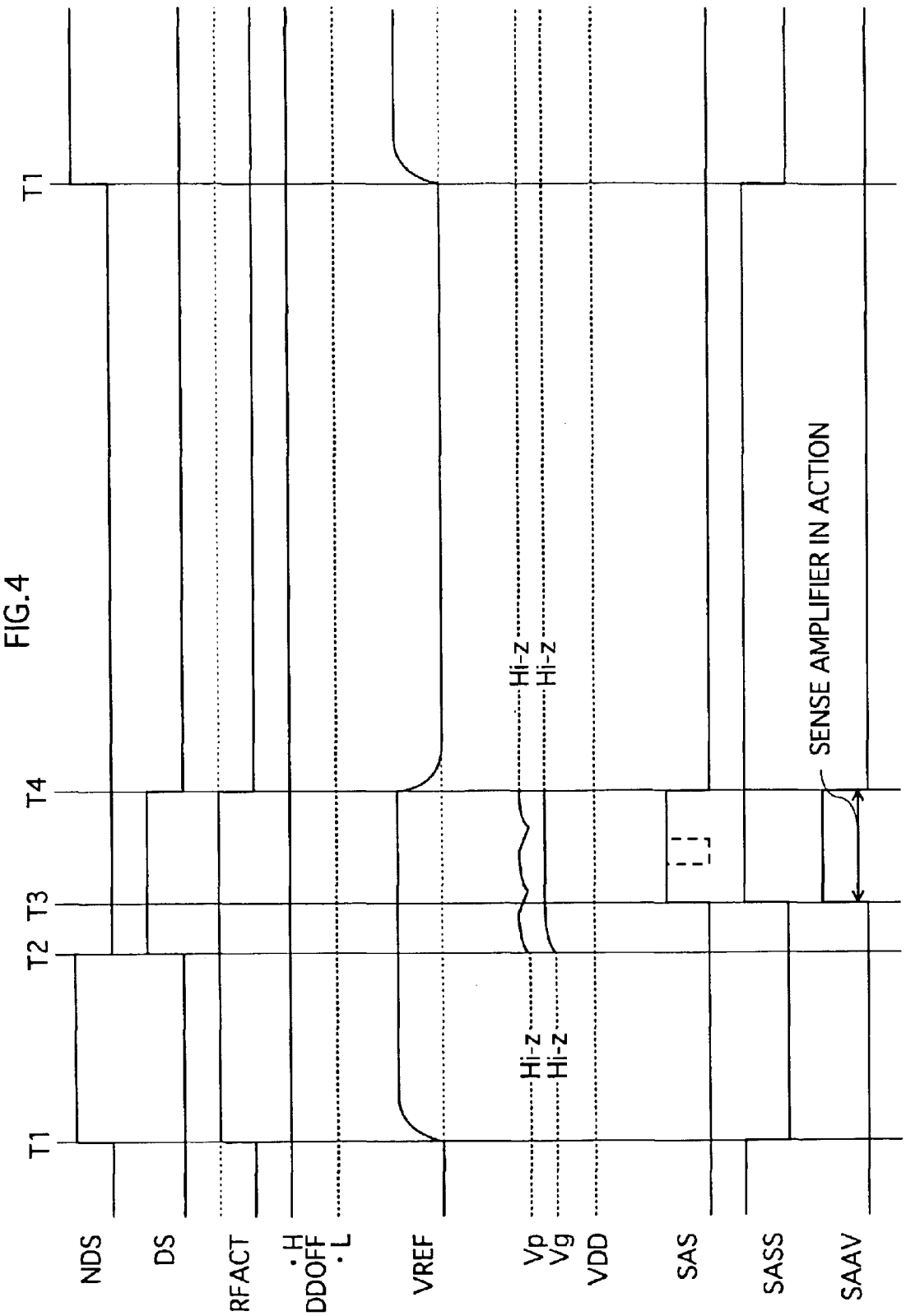
FIG. 4 is a time chart showing an operation of the semiconductor memory device shown in FIG. 3.

FIG. 4 is a time chart showing an operation of the semiconductor memory device 200 having the above construction.

Note here that FIG. 4 shows an operation of the semiconductor memory device 200 when a microcomputer is in a low-speed mode. Accordingly, signal SLOW is constantly high. In the low-speed mode, the semiconductor memory device 200 is controlled by external signal NDS, in the following way. When NDS is high, the semiconductor memory device 200 is on standby where a read is not performed. When NDS is low, a read is performed An interval from T1 at which NDS makes a low to high transition to next T1 is set as one read cycle.

At time T1, NDS transitions from low to high. In response, the control circuit 105 changes signal RFACT from low to high and outputs it. As a result, the reference voltage generator 1 is activated. The reference voltage generator 1 generates reference voltage VREF that is stabilized by time T2.

At time T2, NDS transitions from high to low. In response, the control circuit 105 changes signal DS from low to high and outputs it. As a result, the Vp detector 3, the differential amplifier 100, and the Vg detector 11 are activated. Also, the pulse generator 12 enters a state of waiting for signal SASS from the R latch 107.

Figure 5:
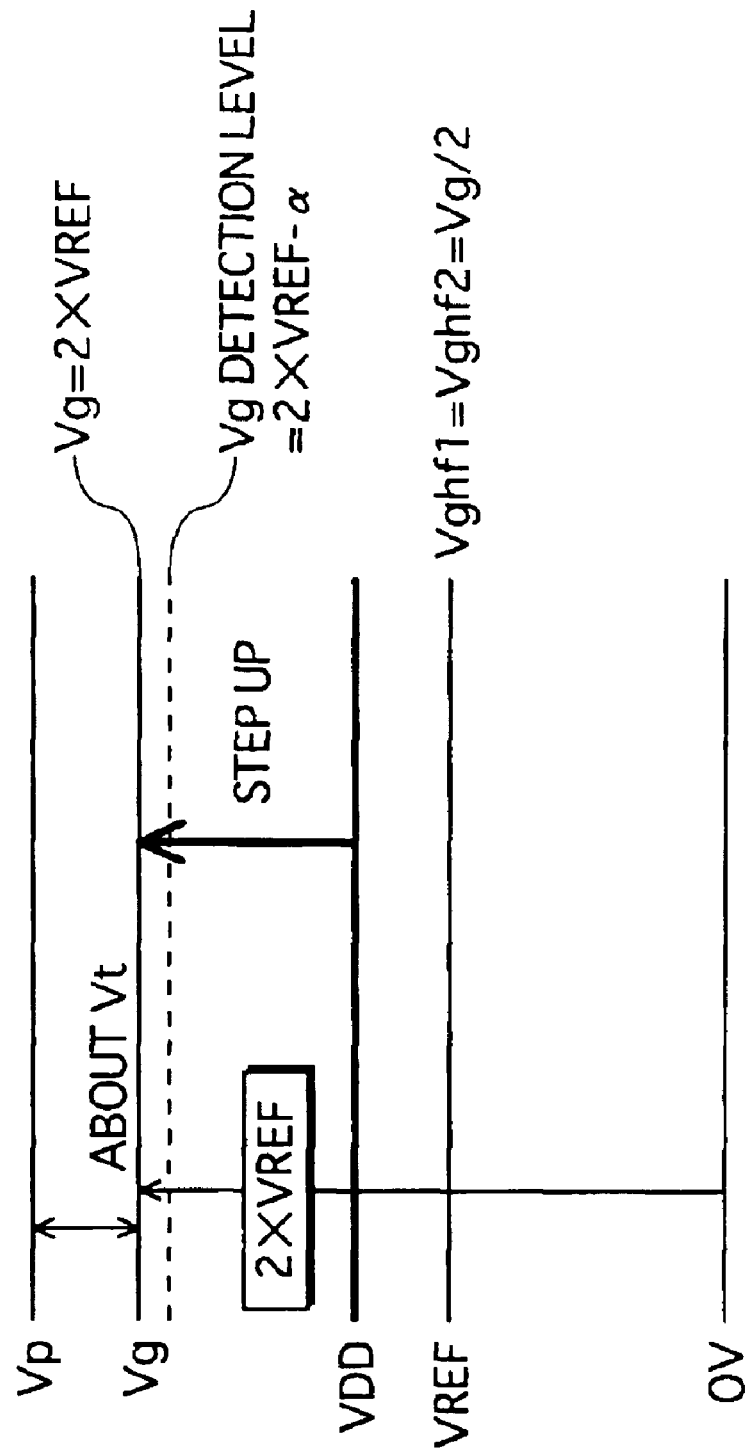
FIG. 5 shows a relationship between Vp, Vg, VDD, and VREF.

The Vp detector 3 is active while DS is high. The Vp detector 3 activates or deactivates the step-up pump 2 according to a detection result of voltage Vp, to keep voltage Vp at about Vg+Vt (Vt is determined based on transistor characteristics, and is about 1V for example). In more detail, when Vp<Vg+Vt, the Vp detector 3 outputs a signal to the step-up pump 2 to activate the step-up pump 2. The step-up pump 2 responsively operates to generate voltage Vp which is higher than power supply voltage VDD, until Vp>Vg+Vt (see a voltage relationship diagram of FIG. 5).

The differential amplifier 100 is active while DS is high. The differential amplifier 100 generates voltage Vg which is double the level of reference voltage VREF, using voltage Vp.

The Vg detector 11 is active while DS is high. At time T3, the Vg detector 11 detects that voltage Vg has reached the targeted level of VREF×2. Upon detecting this, the Vg detector 11 changes signal SAS from low to high and outputs it.

When SAS becomes high, the R latch 107 stores it. The R latch 107 then changes signal SASS from low to high and outputs it.

When SASS becomes high, the pulse generator 12 changes signal SAAV from low to high and outputs it. When the predetermined time period has passed after the low to high transition of SAAV, the pulse generator 12 changes SAAV from high to low. The predetermined time period here is a period necessary for the sense amplifier 9 to draw out a voltage from a selected memory cell of the memory array 7.

When voltage Vg has reached the targeted level at time T3, the row decoder 6 and the column decoder 8 select a word line 111 and a bit line 112 according to address information AddY and AddX, respectively.

When SAAV becomes high, the sense amplifier 9 is activated. The sense amplifier 9 amplifies a voltage of a memory cell at an intersection of the selected word line 111 and bit line 112, and outputs it as DOUT.

When SAAV becomes low at time T4, the data latch 110 latches DOUT output from the sense amplifier 9, and keeps outputting the latched data. Latching here means to hold a specific value. From time T4 of the current cycle to time T4 of the next cycle, the data latch 110 holds DOUT output from the sense amplifier 9 and keeps outputting it.

When SAAV becomes low at time T4, the sense amplifier 9 is deactivated.

Also, when SAAV becomes low at time T4, the control circuit 105 changes DS from high to low. As a result, the Vp detector 3, the differential amplifier 100, and the Vg detector 11 are deactivated.

Thus, the semiconductor memory device 200 repeats the above read cycle of T1 to T4 in sync with NDS. In this repetition, all circuits in the semiconductor memory device 200 are inactive from time T4 of the current cycle to time T1 of the next cycle. Hence no current is consumed during this period. Also, all circuits that supply/extract a charge to/from voltages Vp and Vg are inactive from time T4 of the current cycle to time T2 of the next cycle. Accordingly, voltages Vp and Vg are in a high impedance (Hi-z) state at the levels of time T4, during this period.

In the Hi-z state, a slight discharge occurs due to a junction leak (a leak of current from a junction). This causes voltages Vp and Vg to decrease. However, by stepping up voltages Vp and Vg by the amounts of discharge from time T2 of the next cycle onward, voltages Vp and Vg are brought back to their targeted levels. A time period required for such step up is shorter than a time period required for stepping up voltages Vp and Vg from power supply voltage VDD, with it being possible to significantly reduce the current consumption of the step-up power supply 201.

(Transistors 103 and 104)

The transistors 103 and 104 have the following function.

Suppose voltages Vp and Vg drop to a ground level due to a leak between time T4 and time T2 of the next cycle. In such a case, a large amount of current consumption is needed for the step-up pump 2 and the differential amplifier 100 to raise voltages Vp and Vg from the ground level to the targeted levels from time T2 onward. The transistors 103 and 104 are provided to avoid such current consumption. The transistor 103 is diode-connected between power supply voltage VDD and voltage Vp. Likewise, the transistor 104 is diode-connected between power supply voltage VDD and voltage Vg. This being so, the transistors 103 and 104 serve to keep voltages Vp and Vg from dropping below VDD-Vt due to a current leakage.

(R Latch 107)

The R latch 107 has the following function.

Suppose SAS, which has become high at time T3, prematurely returns to low due to the occurrence of noise that affects voltage Vg or the like, as indicated by a dotted part of the waveform of SAS in FIG. 4. In such a case, the pulse generator 12 which operates in response to SAS changes SAAV to low before time T4, which causes the sense amplifier 9 to fail to completely read information from a selected memory cell. To prevent this, the R latch 107 is provided between the Vg detector 11 and the pulse generator 12.

According to this embodiment, upon detecting that voltage Vg has reached the targeted level, the semiconductor memory device 200 performs a read operation for the predetermined time period. All circuits in the semiconductor memory device 200 are deactivated except while the read operation is being performed. This contributes to a lower current consumption. Also, voltages Vp and Vg are kept from significant decreases until the next read cycle, with it being possible to reduce the amount of current required for stepping up voltages Vp and Vg. Furthermore, the R latch 107 is provided to ensure time necessary for the read operation of the sense amplifier 9.

(Differential Amplifier 100)

A circuit construction of the differential amplifier 100 for keeping voltage Vg from exceeding the targeted level (VREF×2) is described below.

Figure 6:
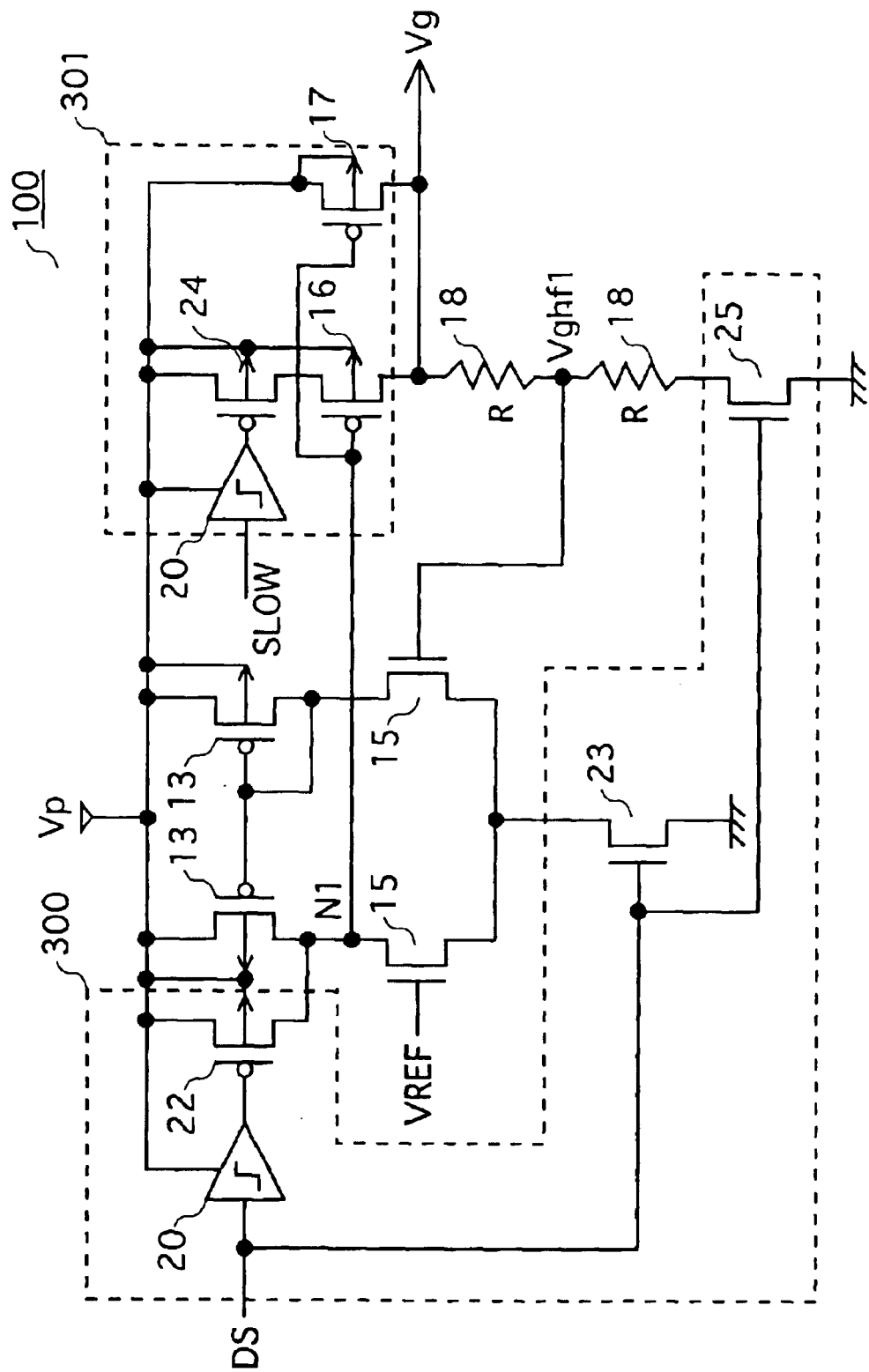
FIG. 6 shows a construction of a differential amplifier shown in FIG. 3.

FIG. 6 shows a construction of the differential amplifier 100.

In the drawing, the differential amplifier 100 includes p-channel transistors 13, 16, 17, 22, and 24, n-channel transistors 15, 23, and 25, resistors 18, and level shifters 20. The two parts enclosed by dotted lines are a stop circuit 300 and a switch circuit 301. Note that the p-channel transistors 13, 16, and 17, the n-channel transistors 15 and 23, and the resistors 18 correspond to a construction of a conventional differential amplifier.

(Stop Circuit 300)

The following explains how to prevent voltage Vg from exceeding the targeted level when voltage Vp is excessively supplied to the differential amplifier 100 upon the activation of the step-up power supply 201 at time T2.

Before time T2, DS is low. Accordingly, the p-channel transistor 22 has a drain and a source conducting, whereas the n-channel transistors 23 and 25 have a drain and a source out of conduction. In this state, the potentials at nodes N1 and Vghf1 are Vp and Vg respectively.

At time T2, DS becomes high. As a result, the p-channel transistors 22 ceases conduction, whilst the n-channel transistors 23 and 25 come into conduction. This being so, the voltage at node Vghf1 drops from Vg to Vg/2. Meanwhile, the voltage at node N1, which is Vp at time T2, does not decrease to such a level that brings the p-channel transistors 16 and 17 into conduction, until node Vghf1 falls below VREF. Thus, the stop circuit 300 enables proper comparison to be conducted as soon as the differential amplifier 100 is activated at time T2. Hence voltage Vg will not exceed the targeted level upon the activation.

(Switch Circuit 301)

The following explains how to prevent an overshoot when a charge is supplied from voltage Vp to voltage Vg.

Figure 7:
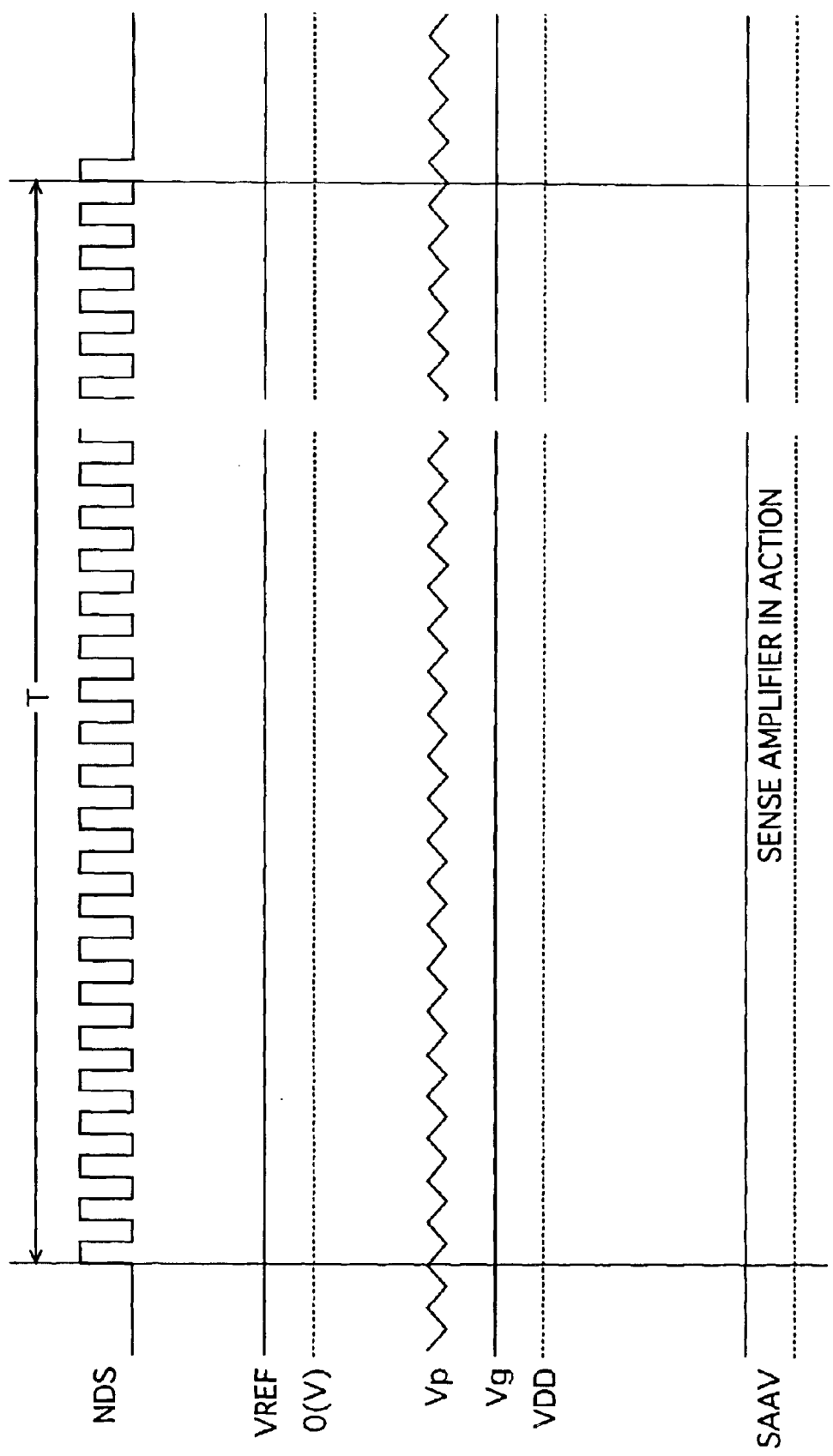
FIG. 7 is a time chart showing an operation of the semiconductor memory device shown in FIG. 3, when a read is performed with a short cycle.

The differential amplifier 100 needs to be capable of a high-speed mode too, where a read is performed with a short cycle of several tens of nanoseconds (see FIG. 7). In the high-speed mode, a current load on voltage Vg occurs with a trailing edge of NDS, as a result of which voltage Vg drops. Such a drop in voltage Vg need be eliminated by the time the next cycle starts after several tens of nanoseconds. Accordingly, the p-channel transistors 16 and 17 are both used to supply a charge from voltage Vp to voltage Vg.

In the low-speed mode where a read is performed with a long cycle of several microseconds or more, on the other hand, if the p-channel transistors 16 and 17 which supply a charge from voltage Vp to voltage Vg are both used, voltage Vg increases so fast due to an excessive charge supply that the differential amplifier 100 cannot respond promptly. When this happens, voltage Vg exceeds the targeted level and results in an overshoot. If a read is performed with such a high voltage, a malfunction occurs. To avoid such an overshoot, the p-channel transistor 24 is brought out of conduction so that the p-channel transistor 16 is not used in the low-speed mode. Thus, the switch circuit 301 is constructed such that only the p-channel transistor 17 is used to supply a charge from voltage Vp to voltage Vg in the low-speed mode.

(Vg Detector 11)

The following describes a circuit construction of the Vg detector 11 for preventing output of a wrong detection result immediately after activation and for reliably detecting voltage Vg at the targeted level.

Figure 8:
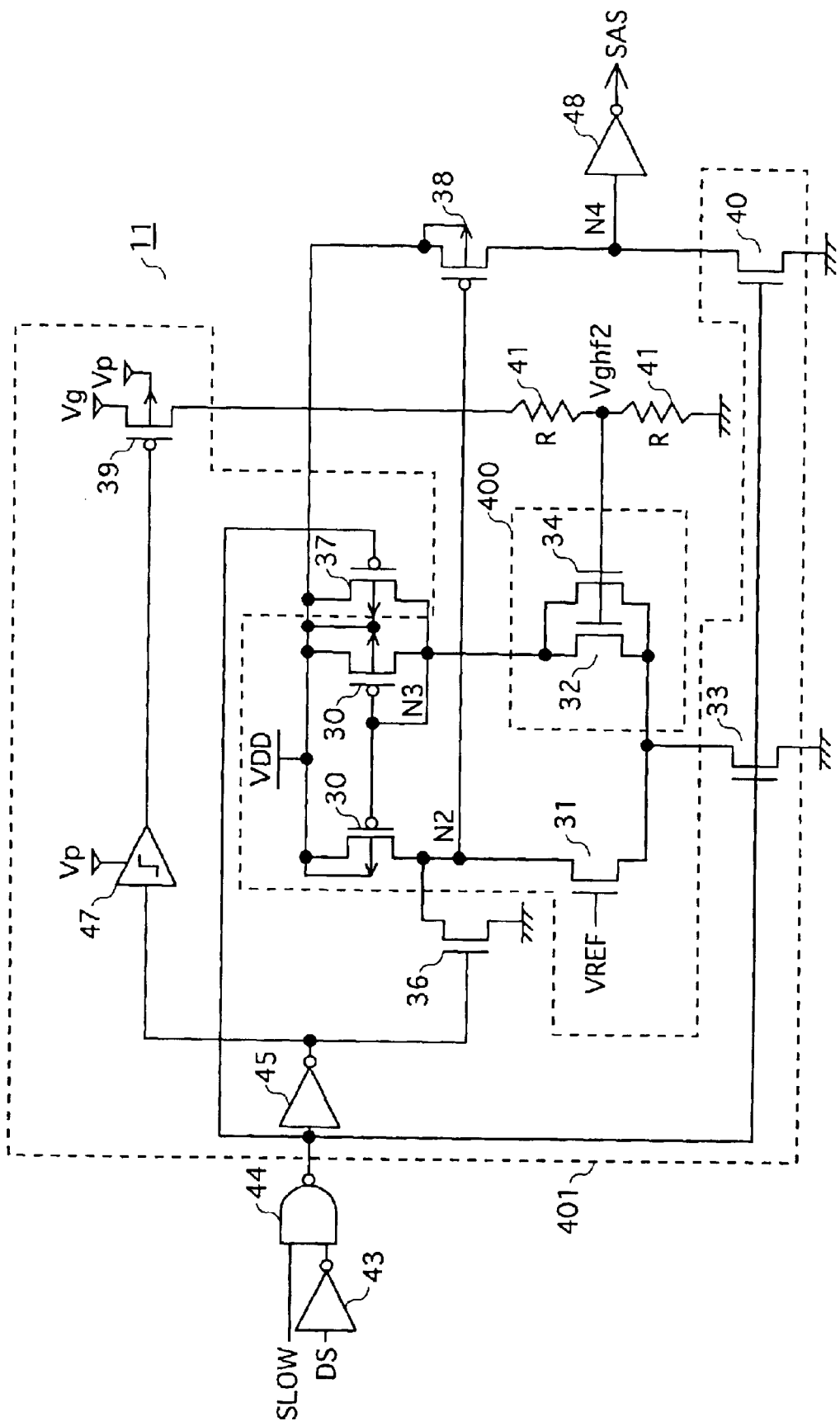
FIG. 8 shows a construction of a Vg detector shown in FIG. 3.

FIG. 8 shows a construction of the Vg detector 11.

In the drawing, the Vg detector 11 includes p-channel transistors 30, 37, 38, and 39, n-channel transistors 31, 32, 33, 34, 36, and 40, resistors 41, a level shifter 47, inverters 43, 45, and 48, and an NAND circuit 44. The two parts enclosed by dotted lines are an offset circuit 400 and a stop circuit 401. Note that the p-channel transistors 30 and 38, the n-channel transistors 31, 32, 33, and 40, and the resistors 41 correspond to a construction of a conventional differential amplifier.

(Stop Circuit 401)

The following explains how to prevent output of a wrong detection result at the time of activation at time T2.

Before time T2, DS is low. Accordingly, the p-channel transistors 37 and the n-channel transistor 36 are conducting between a drain and a source, whilst the p-channel transistor 39 and the n-channel transistors 33 and 40 are out of conduction between a drain and a source. In this state, the potentials at nodes N2 and Vghf2 are both 0V.

Since node N2 is 0V, the p-channel transistor 38 is conducting between a drain and a source. This means node N4 is high, and SAS output from the inverter 48 is low.

Also, since node Vghf2 is 0V, the n-channel transistors 32 and 34 are out of conduction between a drain and a source.

At time T2, DS makes a low to high transition. As a result, the p-channel transistor 37 and the n-channel transistor 36 are brought out of conduction, whereas the p-channel transistor 39 and the n-channel transistors 33 and 40 are brought into conduction.

The states of the nodes immediately after time T2 are the same as those when voltage Vg is below the targeted level of VREF×2. Therefore, SAS remains low immediately after time T2. In this way, a malfunction of switching SAS from low to high when voltage Vg has not reached the targeted level can be avoided.

(Offset Circuit 400)

The following explains how to reliably detect voltage Vg at the targeted level.

The differential amplifier 100 and the Vg detector 11 both use voltage VREF as a reference voltage.

The differential amplifier 100 basically tries to bring voltage Vg to the targeted level of VREF×2. In actuality, however, voltage Vg stabilizes at a level 0.01V lower than the targeted level, due to variations in characteristic of circuit elements and changes in current load. This being so, if the detection level of the Vg detector 11 is set at Vg=VREF×2, SAS output from the Vg detector 11 never transitions from low to high. If SAS does not become high, the read cycle ends without the sense amplifier 9 being activated, which causes a malfunction. To avoid this, the n-channel transistor 34 is parallel-connected to the n-channel transistor 32 which has the same capability as the n-channel transistor 31. In so doing, a differential circuit portion of the Vg detector 11 becomes slightly off-balance, so that the detection level of the Vg detector 11 is slightly decreased to Vg=VREF×2−0.05V which is 0.05V lower than Vg=VREF×2. The amount of decrease is 0.05V in this example, but may be adjusted by varying the capability of the n-channel transistor 34.

It should be noted that the embodied construction may be modified in such a manner that the polarity of each voltage is reversed. In this case, each n-channel transistor in the embodiment is replaced with a p-channel transistor, while each p-channel transistor in the embodiment is replaced with an n-channel transistor.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A semiconductor memory device having a memory array, comprising:

a read unit operable to read and hold information stored in a memory cell in the memory array responsive to an activation of a read pulse signal;

a step-up pump to generate a first voltage stepping up a power supply voltage;

a differential amplifier to generate a second voltage responsive to the first voltage and supply the second voltage to the memory cell, the differential amplifier activated while an internal data strobe signal is active;

a first voltage detector to control stepping un of the step-up pump responsive to a comparison between the first voltage and the second voltage, the first voltage detector activated while the internal data strobe signal is active;

a second voltage detector to output a detection signal responsive to a reference voltage, the second voltage detector activated while the internal data strobe signal is active and the detection signal activated responsive to a detection that the second voltage has reached a predetermined level; and a read pulse generator to output the read pulse signal to control the read unit, the read pulse signal activated responsive to an activation of the detection signal and deactivated when a predetermined time has passed after the detection.

2. A semiconductor memory device having a memory array, comprising:

a read unit operable to read information stored in a memory cell in the memory array;

a step-up unit operable to step up a voltage supplied from outside the semiconductor memory device and supply the stepped-up voltage to the memory cell;

a start control unit operable to have the step-up unit start the stepping up after a read cycle begins;

a detection unit operable to detect that the stepped-up voltage has reached a predetermined level required for the read unit to read the information from the memory cell and have the read unit start the reading upon the detection; and a stop control unit operable to have the step-up unit stop the stepping up, when a predetermined time period required for the read unit to complete the reading has elapsed since the detection, wherein the read unit includes:

a sense amplifier operable to amplify a cell current of the memory cell and output the amplified cell current, the step-up unit includes:

a reference voltage generator operable to generate a constant reference voltage which is no higher than a power supply voltage supplied from outside the semiconductor memory device;

a step-up pump operable to generate a first voltage which is higher than the power supply voltage;

a differential amplifier operable to generate a second voltage using the first voltage and supply the second voltage to the memory cell, the second voltage increasing with time to the predetermined level that is a predetermined multiple of the reference voltage and is higher than the power supply voltage; and a first voltage detector operable to have the first voltage stay within a fixed range, by comparing the first voltage with the second voltage and activating/deactivating the step-up pump depending on a result of the comparison, the detection unit includes:

a second voltage detector operable to (a) detect that the second voltage has reached the predetermined level, by comparing a comparative voltage obtained by stepping down the second voltage with the reference voltage, and (b) activate the sense amplifier upon the detection, the start control unit activates the differential amplifier and the first voltage detector to have the step-up unit start the stepping up, and further activates the second voltage detector, after the read cycle begins, and the stop control unit deactivates the step-up pump, the differential amplifier, and the first voltage detector to have the step-up unit stop the stepping up, and further deactivates the second voltage detector, when the predetermined time period has elapsed since the activation of the sense amplifier.

3. The semiconductor memory device of claim 2, further comprising:

a sense amplifier deactivator operable to deactivate the sense amplifier, when the predetermined time period has elapsed since the activation of the sense amplifier; and a sense amplifier output latch operable to hold the output of the sense amplifier for a fixed time period after the deactivation of the sense amplifier.

4. The semiconductor memory device of claim 2, wherein the second voltage detector outputs a predetermined signal to activate the sense amplifier, and the semiconductor memory device further comprises:

a sense amplifier activation signal latch operable to hold the predetermined signal output from the second voltage detector for a set time period, and output the held signal to the sense amplifier.

5. The semiconductor memory device of claim 2, wherein the differential amplifier includes:

a first n-channel transistor operable to make the comparative voltage which is obtained by dividing the second voltage using a resistance voltage divider, equal to the second voltage upon the deactivation of the differential amplifier;

a second n-channel transistor operable to interrupt a flow of current through a differential circuit portion of the differential amplifier, upon the deactivation of the differential amplifier; and a p-channel transistor having a gate connected to a node on which the second voltage is provided, and operable to short-circuit the node and the step-up pump upon the deactivation of the differential amplifier.

6. The semiconductor memory device of claim 2, wherein the differential amplifier includes:

a plurality of charge supply p-channel transistors each operable to supply a charge generated by the step-up pump to the differential amplifier; and a conduction control p-channel transistor connected in series to at least one charge supply p-channel transistor out of the plurality of charge supply p-channel transistors, and operable to bring the charge supply p-channel transistor into or out of conduction depending on a read mode.

7. The semiconductor memory device of claim 2, wherein the second voltage detector includes:

a differential circuit portion including a first p-channel transistor and a second p-channel transistor which are current-mirror connected;

a third p-channel transistor connected in parallel with the first p-channel transistor which has a gate and a drain connected, and operable to short-circuit the drain of the first p-channel transistor and an output of the power supply voltage upon the deactivation of the second voltage detector;

a first n-channel transistor connected with the second p-channel transistor, and operable to ground a drain of the second p-channel transistor upon the deactivation of the second voltage detector;

a second n-channel transistor operable to interrupt a flow of current through the differential circuit portion upon the deactivation of the second voltage detector;

a fourth p-channel transistor connected with a node on which the second voltage is provided, and operable to change the comparative voltage which is obtained by dividing the second voltage using a resistance voltage divider, to a ground voltage upon the deactivation of the second voltage detector;

a third n-channel transistor and a fifth p-channel transistor connected in series with each other, and operable to convert an output of the differential circuit portion to a logic signal; and a cutoff unit operable to bring the third n-channel transistor out of conduction upon the deactivation of the second voltage detector.

8. The semiconductor memory device of claim 2, wherein the second voltage detector includes:

a first n-channel transistor having a gate which receives the comparative voltage obtained by dividing the second voltage using a resistance voltage divider;

a second n-channel transistor having a gate which receives the reference voltage; and a third n-channel transistor connected in parallel with the first n-channel transistor so that a total capability of the first n-channel transistor connected with the third n-channel transistor is greater than a capability of the second n-channel transistor.

9. The semiconductor memory device of claim 2, further comprising;
a transistor diode-connected with a node on which the first voltage is provided, and operable to supply a charge from an external power supply to the node if the node falls below the power supply voltage after the deactivation of the step-up pump.

10. The semiconductor memory device of claim 2, further comprising:
a transistor diode-connected with a node on which the second voltage is provided, and operable to supply a charge from an external power supply to the node if the node falls below the power supply voltage after the deactivation of the differential amplifier.

11. The semiconductor memory device of claim 1, further comprising:
a control circuit to generate the internal data strobe signal from an external data strobe signal so that a period that the internal data strobe signal is active is shorter than a period that the external data strobe signal is active.

12. The semiconductor memory device of claim 1, further comprising:
a control circuit to generate the internal data strobe signal from an external data strobe signal so that the internal data strobe signal is activated responsive to an activation of the external data strobe signal and deactivated responsive to a deactivation of the read pulse signal.

13. The semiconductor memory device of claim 1, further comprising:
a latch circuit to receive and hold the detection signal responsive to an external data strobe signal, the latch circuit outputting a modified detection signal so that the modified detection signal is activated responsive to an activation of the detection signal and deactivated responsive to a deactivation of the external data strobe signal,
wherein the read pulse generator outputs the read pulse signal so that the read pulse signal is activated responsive to an activation of the modified detection signal.

14. The semiconductor memory device of claim 1, further comprising:
a first hold transistor diode-connected with a node on which the first voltage is provided, and operable to supply a charge from the power supply voltage to the node if the node falls below the power supply voltage after a deactivation of the step-up pump.

15. The semiconductor memory device of claim 1, further comprising:
a second hold transistor diode-connected with a node on which the second voltage is provided, and operable to supply a charge from the power supply voltage to the node if the node falls below the power supply voltage after a deactivation of the differential amplifier.

16. The semiconductor memory device of claim 1, wherein the differential amplifier includes:
a first n-channel transistor operable to make a comparative voltage which is obtained by dividing the second voltage using a resistance voltage divider, equal to the second voltage upon a deactivation of the differential amplifier;
a second n-channel transistor operable to interrupt a flow of current through a differential circuit portion of the differential amplifier, upon the deactivation of the differential amplifier; and
a p-channel transistor having a gate connected to a node on which the second voltage is provided, and operable to short-circuit the node and the step-up pump upon the deactivation of the differential amplifier.

17. The semiconductor memory device of claim 1, wherein the differential amplifier includes:
a plurality of charge supply p-channel transistor each operable to supply a charge generated by the step-up pump to the differential amplifier;
a conduction control p-channel transistor connected in a series to at least one charge supply p-channel transistor out of the plurality of charge supply p-channel transistors, and operable to bring the charge supply p-channel transistor into or out of conduction depending on a read mode.

18. The semiconductor memory device of claim 1, wherein the second voltage detector includes:
a differential circuit portion including a first p-channel transistor and a second p-channel transistor which are current-mirror connected;
a third p-channel transistor connected in parallel with the first p-channel transistor which has a gate and a drain connected, and operable to short-circuit the drain of the first p-channel transistor and an output of the power supply voltage upon a deactivation of the second voltage detector;
a first n-channel transistor connected with the second p-channel transistor, and operable to ground a drain of the second p-channel transistor upon the deactivation of the second voltage detector;
a second n-channel transistor operable to interrupt a flow of current through the differential circuit portion upon the deactivation of the second voltage detector;
a fourth p-channel transistor connected with a node on which the second voltage is provided, and operable to change a comparative voltage which is obtained by dividing the second voltage using a resistance voltage divider, to a ground voltage upon the deactivation of the second voltage detector;
a third n-channel transistor and a fifth p-channel transistor connected in series with each other, and operable to convert an output of the differential circuit portion to a logic signal; and
a cutoff unit operable to bring the third n-channel transistor out of conduction upon the deactivation of the second voltage detector.

19. The semiconductor device of claim 1, wherein the second voltage detector includes:
a first n-channel transistor having a gate which receives a comparative voltage obtained by dividing the second voltage using a resistance voltage divider;
a second n-channel transistor having a gate which receives the reference voltage; and
a third n-channel transistor connected in parallel with the first n-channel transistor so that a total capability of the first n-channel transistor connected with the third n-channel transistor is greater than a capability of the second n-channel transistor.

* * * * *

UNITED STATES PATENT AND TRADEMARK OFFICE
CERTIFICATE OF CORRECTION

PATENT NO. : 6,826,087 B2
DATED : November 30, 2004
INVENTOR(S) : Ryotaro Azuma

It is certified that error appears in the above-identified patent and that said Letters Patent is hereby corrected as shown below:

Column 12,
Line 42, after the word "stepping" delete "un" and insert -- up --.

Signed and Sealed this

Twenty-sixth Day of April, 2005

JON W. DUDAS
*Director of the United States Patent and Trademark Office*